(12) United States Patent
Lee et al.

(10) Patent No.: US 12,059,714 B2
(45) Date of Patent: Aug. 13, 2024

(54) APPARATUSES FOR PROCESSING A SUBSTRATE AND METHODS OF PROCESSING A SUBSTRATE

(71) Applicant: Semes Co., Ltd., Cheonan-si (KR)

(72) Inventors: Sangmin Lee, Seoul (KR); Joojib Park, Asan-si (KR); Euisang Lim, Cheonan-si (KR)

(73) Assignee: Semes Co., Ltd., Cheonan-si (KR)

( * ) Notice: Subject to any disclaimer, the term of this patent is extended or adjusted under 35 U.S.C. 154(b) by 0 days.

(21) Appl. No.: 18/492,021

(22) Filed: Oct. 23, 2023

(65) Prior Publication Data

US 2024/0042497 A1 Feb. 8, 2024

Related U.S. Application Data

(62) Division of application No. 17/658,163, filed on Apr. 6, 2022, now Pat. No. 11,833,555.

(30) Foreign Application Priority Data

May 11, 2021 (KR) .......................... 10-2021-0060817

(51) Int. Cl.
*B08B 3/02* (2006.01)
*B08B 7/00* (2006.01)
(Continued)

(52) U.S. Cl.
CPC ............ *B08B 7/0021* (2013.01); *B08B 13/00* (2013.01); *H01L 21/67011* (2013.01)

(58) Field of Classification Search
CPC ...................................................... B08B 3/22
See application file for complete search history.

(56) References Cited

U.S. PATENT DOCUMENTS

2022/0362817 A1 11/2022 Lee et al.

FOREIGN PATENT DOCUMENTS

| KR | 10-1151776 B1 | 5/2012 |
| KR | 10-1493309 B1 | 2/2015 |

(Continued)

OTHER PUBLICATIONS

U.S. Restriction Requirement dated May 11, 2023 for U.S. Appl. No. 17/658,163; 8 Pages.

(Continued)

*Primary Examiner* — Jason Y Ko
(74) *Attorney, Agent, or Firm* — DALY, CROWLEY, MOFFORD & DURKEE, LLP

(57) ABSTRACT

An apparatus for processing a substrate may include an upper chamber, a lower chamber being combined with the upper chamber and separated from the upper chamber, and at least one driving member for moving the lower chamber in an upward direction and a downward direction. The least one driving member may include a supporting element for supporting the lower chamber, a first driving element for moving the lower chamber and the supporting element, a second driving element for moving the lower chamber, the supporting element and the first driving element, the second driving element being disposed adjacent to the first driving element, and a connecting element for connecting the first driving element to the second driving element. A processing space may be provided between the upper chamber and the lower chamber when the lower chamber is combined with the upper chamber.

5 Claims, 4 Drawing Sheets

(51) Int. Cl.
*B08B 13/00* (2006.01)
*H01L 21/67* (2006.01)

(56) References Cited

FOREIGN PATENT DOCUMENTS

| KR | 10-2015-0026091 A | 3/2015 |
| KR | 10-2019-0117566 A | 10/2019 |

OTHER PUBLICATIONS

Response to U.S. Restriction Requirement dated May 11, 2023 for U.S. Appl. No. 17/658,163; Response filed Jun. 23, 2023; 1 Page.
U.S. Notice of Allowance dated Sep. 21, 2023 for U.S. Appl. No. 17/658,163; 7 Pages.

APPARATUSES FOR PROCESSING A SUBSTRATE AND METHODS OF PROCESSING A SUBSTRATE

CROSS-REFERENCE TO RELATED APPLICATION

This application is a divisional of U.S. patent application Ser. No. 17/658,163 filed on Apr. 6, 2022, which claims priority to Korean Patent Application No. 10-2021-0060817 filed on May 11, 2021 in the Korean Intellectual Property Office (KIPO), the contents of which are herein incorporated by reference in its entirety.

BACKGROUND

1. Field

Example embodiments of the invention relate to an apparatus for processing a substrate and a method of processing a substrate. More particularly, example embodiments of the invention relate to an apparatus for processing a substrate including a process chamber providing a processing space in which a desired process may be performed, and a method of processing a substrate using the apparatus for processing a substrate.

2. Related Technology

In manufacturing processes for a display device such as an organic light emitting display device, a predetermined process such as a cleaning process may be performed on a substrate in a sealed processing space having a relatively high pressure. Such a processing space may be provided in a process chamber having a configuration in which a lower chamber moves toward an upper chamber such that the lower chamber is combined with the upper chamber.

In a conventional apparatus for processing a substrate, the lower chamber may be generally moved in an upward direction and a downward direction using two driving members arranged in serial under the lower chamber. However, the two driving members ate disposed in serial so that driving shafts of the driving members may need an increased space for stroke so as to move the lower chamber along the upward and downward directions. Therefore, the conventional apparatus for processing a substrate may require a relatively large size and a relatively complicate configuration. Further, since the conventional apparatus for processing a substrate may have a structure in which the driving members are disposed under one end portion of the lower chamber, the lower chamber may be tilted while moving the lower chamber by the driving members. Thus, the lower chamber may not be correctly combined with the upper chamber and also the stability of the lower chamber may be considerably reduced.

SUMMARY

One aspect of the invention provides an apparatus for processing a substrate capable of improving a stability of a lower chamber while moving the lower chamber using at least one driving member in an upward direction and a downward direction.

Another aspect of the invention provides an apparatus for processing a substrate capable of improving a stability of a lower chamber while moving the lower chamber using two driving members symmetrically disposed.

Still another aspect of the invention provides a method of processing using an apparatus for processing a substrate capable of improving a stability of a lower chamber while moving the lower chamber using at least one driving member in an upward direction and a downward direction.

According to one aspect of the invention, there is provided an apparatus for processing a substrate which may include an upper chamber, a lower chamber being combined with the upper chamber and separated from the upper chamber, and at least one driving member for moving the lower chamber in an upward direction and a downward direction. The least one driving member may include a supporting element for supporting the lower chamber, a first driving element for moving the lower chamber and the supporting element, a second driving element for moving the lower chamber, the supporting element and the first driving element, the second driving element being disposed adjacent to the first driving element, and a connecting element for connecting the first driving element to the second driving element. A processing space may be provided between the upper chamber and the lower chamber when the lower chamber is combined with the upper chamber.

In example embodiments, the first driving element may include a first driving shaft and a first body and the second driving element may include a second driving shaft and a second body. Here, the first and second driving elements may be disposed in parallel.

In example embodiments, the connecting element may include a first portion horizontally connected to a bottom face of the first body, a second portion horizontally connected to an upper face of the second driving shaft, and a middle portion vertically connecting the first portion to the second portion.

In example embodiments, the driving member may be connected to one end portion of the supporting element. In this case, the apparatus for processing a substrate may additionally include a compensating member connected to the other end portion of the supporting element for balancing the supporting element and the lower chamber.

In example embodiments, the compensating member may include a guiding element passing through the other end portion of the supporting element. For example, the guiding element may include an LM guide.

In some example embodiments, the compensating member may include a spring element connected to the other end portion of the supporting element and an inner upper portion of the apparatus for processing a substrate.

In other example embodiments, the compensating member may include a rod element connected to the first driving element and a bottom of the apparatus for processing a substrate. Here, the rod element may move to the bottom of the apparatus for processing a substrate after the supporting element and the lower chamber move in the upward direction.

In example embodiments, the apparatus for processing a substrate may additionally include a balancing member coupled to a side portion of the second body of the second driving element and extended toward the connecting element. The balancing member may prevent a tinting of the first driving element and/or the second driving element while moving the supporting element and the lower chamber in the upward and downward directions.

In example embodiments, the apparatus for processing a substrate may additionally include a discharging member passed though the supporting element and connected to a central portion of a bottom of the lower chamber.

According to another aspect of the invention, there is provided an apparatus for processing a substrate which may include a process chamber including an upper chamber and a lower chamber being combined with the upper chamber and separated from the upper chamber, and a first driving member and a second driving member for moving the lower chamber in an upward direction and a downward direction. The first driving member may include a supporting element for supporting the lower chamber, a first driving element connected to one end portion of the supporting element, a second driving element disposed adjacent to the first driving element, and a first connecting element connecting the first driving element to the second driving element. The second driving member may include a third driving element connected to the other end portion of the supporting element, a fourth driving element disposed adjacent to the third driving element, and a second connecting element connecting the third driving element to the fourth driving element.

In some example embodiments, the first driving element may include a first driving shaft and a first body, the second driving element may include a second driving shaft and a second body, the third driving element may include a third driving shaft and a third body, and the fourth driving element may include a fourth driving shaft and a fourth body.

In some example embodiments, the first and second driving members may be symmetrically disposed. Here, the first and second driving elements may be disposed in parallel, and the third and fourth driving elements may be disposed in parallel.

In some example embodiments, the apparatus for processing a substrate may additionally include a first balancing member connected to the first and second driving elements to prevent a tinting of the first driving element and/or the second driving element; and a second balancing member connected to the third and fourth driving elements to prevent a tinting of the third driving element and/or the fourth driving element.

In some example embodiments, the apparatus for processing a substrate may additionally include an adjusting member connecting the first driving member to the second driving member to prevent the supporting element and the lower chamber from being bent.

In some example embodiments, the adjusting member may have a plate structure in which a central portion has a thickness smaller than thicknesses of both lateral portions, and the central portion may have a though hole though which a discharging member passes.

According to still another aspect of the invention, there is provided a method of processing a substrate which may include pacing a substrate on a supporting member coupled to an upper chamber; combining a lower chamber with the upper chamber using a driving element including s supporting element for supporting the lower chamber, a first driving element for moving the lower chamber and the supporting element; a second driving element for moving the lower chamber, the supporting element and the first driving element, the second driving element being disposed adjacent to the first driving element and a connecting element for connecting the first driving element to the second driving element, and performing a predetermined process on the substrate positioned in a processing space provided between the lower chamber and the upper chamber.

In example embodiments, the driving member may be connected to one end portion of the supporting element, and the supporting element and the lower chamber may be balanced by a compensating member connected to the other end portion of the supporting element.

In example embodiments, the first driving element may include a first driving shaft and a first body, the second driving element may include a second driving shaft and a second body, and the first and second driving elements may be disposed in parallel.

In example embodiments, a tinting of the first driving element and/or the second driving element may be prevented by a balancing member coupled to the second driving element and extended toward the connecting element while the supporting element and the lower chamber moves in the upward and downward directions.

In example embodiments, the predetermined process may include a cleaning process using a supercritical fluid.

According to example embodiments of the invention, the apparatus for processing a substrate may include the driving member having the first and second driving elements disposed in parallel, and one of both of the first and second driving elements may move the lower chamber. Therefore, a stroke of the first driving shaft of the driving element and/or the second driving shaft of the second driving element may be minimized. As a result, the apparatus for processing a substrate may have a relatively simplified structure and also may have a reduced entire area. Further, the apparatus for processing a substrate may include the compensating member coupled to the other end portion of the supporting element so as to balance the lower chamber and the supporting element without tiltings of the lower chamber and the supporting element. Therefore, the lower chamber and the supporting element may be moved stably by the compensating member without the tiltings of the lower chamber and the supporting element while the lower chamber and the supporting element are not sloped downwardly.

BRIEF DESCRIPTION OF THE DRAWINGS

Example embodiments will be more clearly understood from the following detailed description taken in conjunction with the accompanying drawing. The following figures represent non-limiting, example embodiments as described herein.

DESCRIPTION OF EMBODIMENTS

Figure 1:
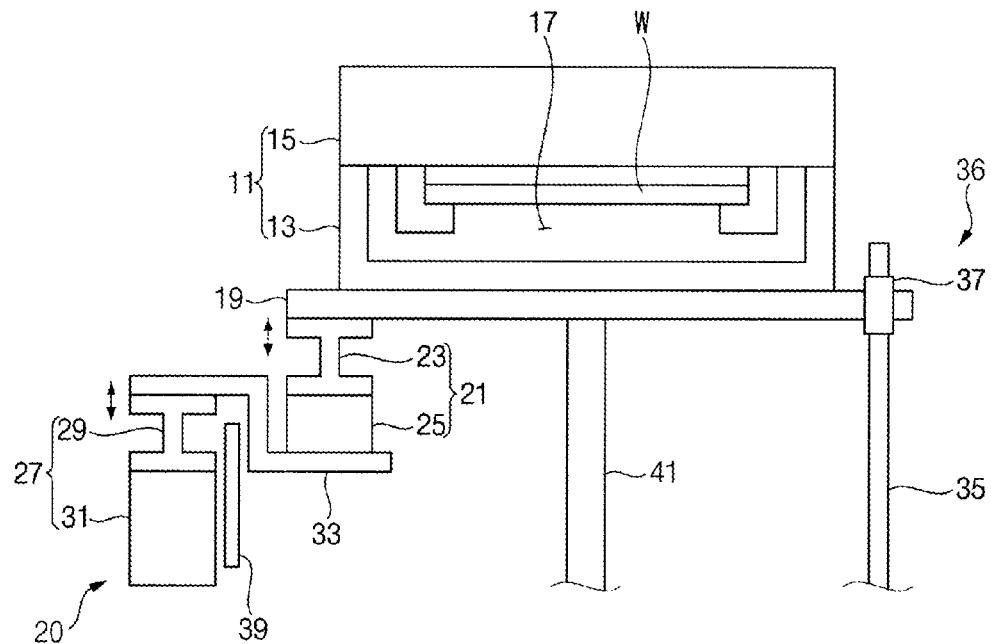
FIG. 1 is a cross-sectional view illustrating an apparatus for processing a substrate in accordance with example embodiments of the invention.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art.

In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the invention will be described in detail with reference to the accompanying drawings. Like elements or components can be indicated by like reference numerals throughout the drawings, and the repeated explanations of like elements or components may be omitted.

FIG. 1 is a cross-sectional view illustrating an apparatus for processing a substrate in accordance with example embodiments of the invention.

Referring to FIG. 1, an apparatus for processing a substrate according to example embodiments may be used in processes of manufacturing an integrated circuit device such as a semiconductor device. Particularly the apparatus for processing a substrate may perform a predetermined process on a substrate W in a sealed processing space provided by a process chamber having a relatively high interior pressure. For example, the apparatus for processing a substrate may be utilized in a cleaning process for removing undesired materials such as organic solvent and impurities from the substrate W using a supercritical fluid. Here, the supercritical fluid may include supercritical carbon dioxide.

In example embodiments, the apparatus for processing a substrate may include a process chamber 11 wherein the process chamber 11 may have an upper chamber 15, a lower chamber 13 and a processing space 17 between the upper chamber 15 and the lower chamber 13. The processing space 17 may be defined and sealed by the upper chamber 15 and the lower chamber 13. The predetermined process, for example, the cleaning process may be performed on the substrate W in the processing space 17 using the supercritical fluid. Additionally, the apparatus for processing a substrate may include at least one driving member 20 capable of moving the lower chamber 13 in an upward direction and a downward direction with respect to the upper chamber 15.

The at least one driving member 20 may move the lower chamber 13 toward the upper chamber 15 in the upward direction such that the sealed processing space 17 may be formed between the upper chamber 15 and the lower chamber 13. In addition, the at least one driving member 20 may move the lower chamber 13 away from the upper chamber 15 in the downward direction. In this case, a maintenance process may be executed on the apparatus for processing a substrate including the upper chamber 15, the lower chamber 13, the at least one driving member 20, etc.

In example embodiments, the substrate W may be disposed such that the substrate W may be closer the upper chamber 15 than the lower chamber 13 in the processing spacer 17. In other words, the substrate W may be placed adjacent to the upper chamber 15. For example, the substrate W may be supported by a supping member that may be suspended from a bottom of the upper chamber 15 in the downward direction. Such a supping member may hold a peripheral portion of the substrate (W).

As illustrated in FIG. 1, the at least one driving member 20 may move the lower chamber 13 in the upward direction such that the lower chamber 13 may be combined with the upper chamber 15. Further, the driving member 20 may move the lower chamber 13 in the downward direction so that the lower chamber 13 may be separated from the upper chamber 15. In exam embodiments, the at least one driving member 20 may include a supporting element 19, a first driving element 21, a second driving element 27 and a connecting element 33.

The supporting element 19 may support a bottom face of the lower chamber 13. For example, the supporting element 19 may include a plate structure having a substantially flat upper face which lower chamber 13 is placed. In addition, the supporting element 19 may have an area substantially larger than an area of the bottom of the lower chamber 13. Therefore, the supporting element 19 may stably support the lower chamber 13 while the apparatus for processing a substrate performed the apparatus for processing a substrate performed the predetermined process, for example, the cleaning process on the substrate W.

The first driving element 21 may move the lower housing 13 and the supporting element 19 in the upward and downward directions. The first driving element 21 may be coupled to one end portion of the supporting element 19. In example embodiments, the first driving element 21 may include a first driving shaft 23 and a first body 25. The first driving shaft 23 may be connected to one end portion of a bottom of the supporting element 19 and the first body 25 may be coupled to the first driving shaft 23. Although it is not illustrated, the first driving element 21 may additionally include a first motor for providing a first driving force to the first driving shaft 23. For example, the first motor may be integrally formed with the first body 25. The first driving shaft 23 may move along the upward and downward directions by the first driving force applied from such a first motor, and thus the lower chamber 13 and the supporting element 19 may also move in the upward and downward directions.

The second driving element 27 may move the lower chamber 13, the supporting element 19 and the first driving element 21 in the upward and downward directions. The second driving element 27 may be disposed adjacent to the first driving element 21. The second driving element 27 may include a second driving shaft 29 and a second body 31. Although it is not illustrated, the second driving element 27 may additionally include a second motor for providing a second driving force to the second driving shaft 29. For example, the second motor may be integrally formed with the second body 31. The second motor may apply the second driving force to the second driving shaft 29 so that the second driving shaft 29 may move along the upward and downward directions.

As illustrated in FIG. 1, the second driving element 27 may be disposed under the first driving element 21. The first driving element 21 and the second driving element 27 are disposed in parallel. For example, the second driving shaft 29 may be located under the second driving shaft 23 and the second body 31 may be positioned under the first body 25. The first driving element 21 may be separated from the second driving element 27 by a predetermined distance. In this case, the connecting element 33 may connect the first driving element 21 to the second driving element 27.

As described above, the first and second driving elements 21 and 27 may be disposed in parallel so that the first and second driving elements 21 and 27 may move along separate paths, respectively. For example, the first driving element 21 may move along a first path represented by one arrow under the supporting element 19 and the second driving element 27 may move along a second path indicated by the other arrow adjacent to the first path. Therefore, the first path of the movement of the first driving element may not overlap the second path of the movement of the second driving element 27.

The connecting element 33 may include a first portion coupled to the first driving element 21, a second portion coupled to the second driving element 27, and a middle portion connecting the first portion to the second portion. For example, the first portion may be horizontally connected to a bottom face of the first body 25 and the second portion may be horizontally connected to an upper face of the second driving shaft 29. The middle portion may connect the first portion to the second portion in a vertical direction. In other words, the connecting element 33 may include the first and the second portions horizontally disposed relative to the supporting element 19 and the middle portion vertically disposed with respect to the supporting element 19.

In example embodiments, the second driving element 27 may move the first driving element 21 along the upward and downward directions and the first driving element 21 may simultaneously move the supporting element 19 in the upward and downward directions. In this case, the first and second driving elements 21 and 27 may move together since the first and second driving elements 21 and 27 are connected each other by the connecting member 33. With the movements of the second driving element 27, the first driving element 21 and the supporting element 19, the lower chamber 13 may be combined with the upper chamber 15 in the predetermined process whereas the lower chamber 13 may be separated from the upper chamber 15 before and after the predetermined process. When the lower chamber 13 is combined with the upper chamber 15, the processing space 17 for processing the predetermined process may be formed between the lower chamber 13 and the upper chamber 15. In case that the lower chamber 13 is separated from the upper chamber 15, the substrate W may be loaded on the supporting member coupled to the upper chamber 15 or may be unloaded from the supporting member. Further, the maintenance process may be executed about the lower chamber 13 and/or the upper chamber 15 when the lower chamber 13 is separated from the upper chamber 15.

In some example embodiments, one of the first driving element 21 and the second driving element 27 may be operated so as to move the lower chamber 13 in the upward and downward directions. For example, the second driving element 27 may move the first driving element 21 and the supporting element 19, or the first driving element 21 may move the second driving element 27 and the supporting element 19. Thus, the lower chamber 13 may combined with the upper chamber 15 or may be separated from the upper chamber 15 by any one of the first driving element 21 and the second driving element 27.

As described above, the apparatus for processing a substrate may include the driving member 20 having the first and second driving elements 21 and 27 disposed in parallel, and one of both of the first and second driving elements 21 and 27 may move the lower chamber 13. Since the lower chamber 13 may be moved in the upward and downward directions by such driving member 20, a stroke of the first driving shaft 23 of the driving element 21 and/or the second driving shaft 29 of the second driving element 27 may be minimized. Therefore, the apparatus for processing a substrate may have a relatively simplified structure and also may have a reduced entire area.

Referring now to FIG. 1, the driving member 20 including the first and second driving elements 21 and 27 may be coupled to one end portion of the supporting element 19 so that a force for moving the supporting element 19 may be applied to one end portion of the supporting element 19 only. Thus, the driving member 20 may not sufficiently move the lower chamber 13 in the upward and downward directions as well as one end portion or the other end portion of the supporting element 19 may be sloped downwardly while the driving member 20 moves the supporting element 19 and the lower chamber 13. Particularly, the supporting element 19 may have the area relatively larger than that of the lower chamber 13 and the first and second driving elements 21 and 27 are connected to one end portion of the supporting element 19 such that the force for moving the supporting element 19 and the lower chamber 13 may be applied from the first and second driving elements 21 and 27 to only one end portion of the supporting element 19 (that is, one end portion of the lower chamber 13). Hence, one end portion of the lower chamber 13 (i.e., one end portion of the supporting element 19) may be sloped downwardly when the driving member 20 moves the lower chamber 13 in the downward direction. In addition, when the driving member 20 moves the lower chamber 13 in the upward direction, the other end portion of the lower chamber 13 (i.e., the other end portion of the supporting element 19) may be sloped downwardly.

Considering the above-described problems, the apparatus for processing a substrate may additionally include a compensating member 36. The compensating member 36 may prevent the supporting element 19 and the lower chamber 13 from being tilted by the force for moving the supporting element 19 applied to one end portion of the supporting element 19 from the first driving element 21 and/or the second driving element 27. In other words, the compensating member 36 may balance the supporting element 19 and the lower chamber 13 so as to prevent the supporting element 19 and the lower chamber 13 from being tilted upwardly or downwardly while the first driving element 21 and/or the second driving element 27 moves the supporting element 19. As illustrated in FIG. 1, the compensating member 36 may include a guiding element 35 and a bearing 37. The guiding element 35 may be coupled to the other end portion of the supporting element 19. For example, the guiding element 35 may include an LM guide which may pass through the other end portion of the supporting element 19. Here, the bearing 37 may connect the guiding element 35 to the other end portion of the supporting element 19 such that the supporting element 19 may have proper degree of freedom.

According to example embodiments, the apparatus for processing a substrate may include the compensating member 36 coupled to the other end portion of the supporting element 19 so as to balance the lower chamber 13 and the supporting element 19 without the tiltings of the lower chamber 13 and the supporting element 19 by the force for moving the supporting element 19 applied to one end portion of the supporting element from the first driving element 21 and/or the second driving element 27. Therefore, the lower chamber 13 and the supporting element 19 may be moved stably by the compensating member 36 without the tiltings of the lower chamber 13 and the supporting element 19 while the lower chamber 13 and the supporting element 19 are not sloped downwardly.

In example embodiments, the first driving element 21 may be tilted toward the second driving element 27, or the second driving element 27 may be tilted toward the first driving element 21 while the driving member 20 moves the lower chamber 13 because the first and second driving elements 21 and 27 are coupled to one end portion of the supporting element 19. To prevent such tilting of the first driving element 21 and/or the second driving element 27, the apparatus for processing a substrate may additionally include a balancing member 39 disposed between the first driving element 21 and the second driving element 27. The balancing member 33 may be coupled to a side portion of the second body 31 of the second driving element 27, and may be extended toward the connecting element 33. Thus, the balancing member 33 may move together with the second driving element 27 to prevent the tinting of the first driving element 21 and/or the second driving element 27 while the supporting element 19 moves in the upward and downward directions. For example, the balancing member 33 may have an antenna structure, which may be extended toward the connecting element 33 by a moving distance of the second driving shaft 29 when the second driving element 27 moves in the upward direction, and also may contracted toward the second body 31 by the moving distance of the second driving shaft 29 when the second driving element 27 moves in the downward direction.

In some example embodiments, the connecting element 33 may have a through hole (not illustrated) and one end portion of the balancing member 33 may pass through the through hole of the connecting element 33. Thus, the balancing member 33 may more easily move together with the second driving element 27 in the upward and downward directions.

Referring FIG. 1 again, the apparatus for processing a substrate may additionally include a discharging member 41 which may discharge the used supercritical fluid from the processing space 17 of the process chamber 11 after the apparatus for processing a substrate performed the predetermined process, for example, the cleaning process on the substrate W using the supercritical fluid. The discharging member 41 may pass through the supporting element 19 and may be coupled to a central portion of the bottom of the lower chamber 13. For example, the discharging member 41 may include a flexible tube or a bellows tube such that a flow of the supercritical fluid may not be affected by the movements of the supporting element 19 and the lower chamber 13.

Figure 2:
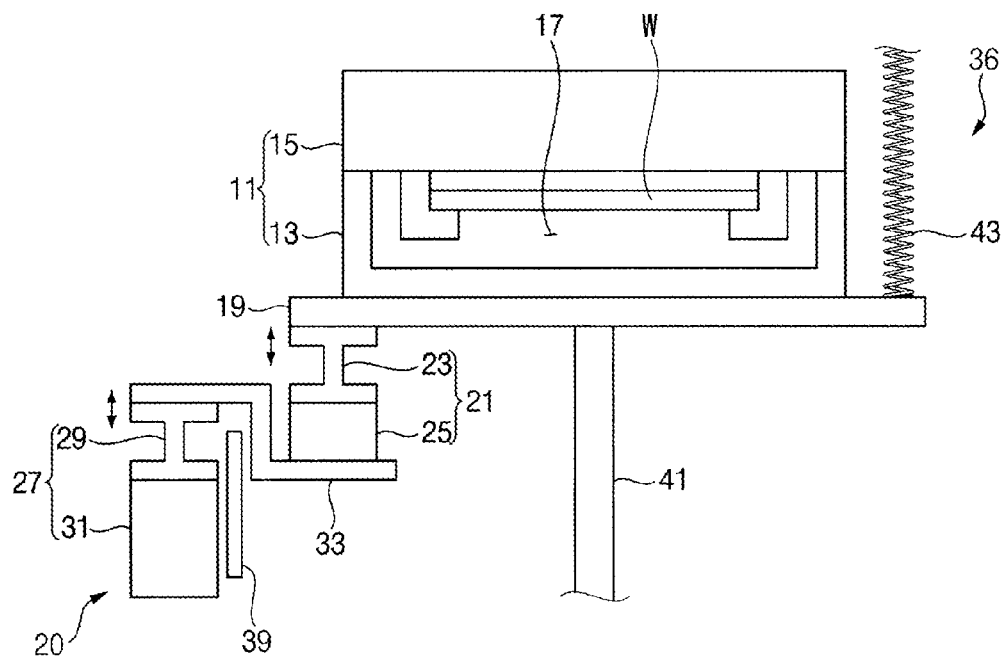
FIG. 2 is a cross-sectional view illustrating an apparatus for processing a substrate in accordance with some example embodiments of the invention.

FIG. 2 is a cross-sectional view illustrating an apparatus for processing a substrate in accordance with some example embodiments of the invention. The apparatus for processing a substrate in FIG. 2 may have a configuration substantially the same as or similar to the configuration of the apparatus for processing a substrate described with reference to FIG. 1 except a compensating member.

Referring to FIG. 2, the apparatus for processing a substrate may include a compensating member 36 disposed between the other end portion of the supporting element 19 and an inside upper portion of the apparatus for processing a substrate over the process chamber 11. In this case, the compensating member 36 may include a spring element 43 which may connect the other end portion of the supporting element 19 to the inside upper portion of the apparatus for processing a substrate.

In some example embodiments, the spring element 43 may prevent the lower chamber 13 and the supporting element 19 from being tilted upwardly or downwardly by the force for moving the lower chamber 13 applied to one end portion of the supporting element 19 from the first driving element 21 and/or the second driving element 27 connected to one end portion of the supporting element 19. That is, the spring element 43 may balance the lower chamber 13 and the supporting element 19 while the lower chamber 13 and the supporting element 19 moves in the upward and downward directions by the first driving element 21 and/or the second driving element 27. Therefore, the supporting element 19 and the lower chamber 13 may stably move in the upward and downward directions by the spring element 43 without the tiltings of the supporting element 19 and the lower chamber 13.

Figure 3:
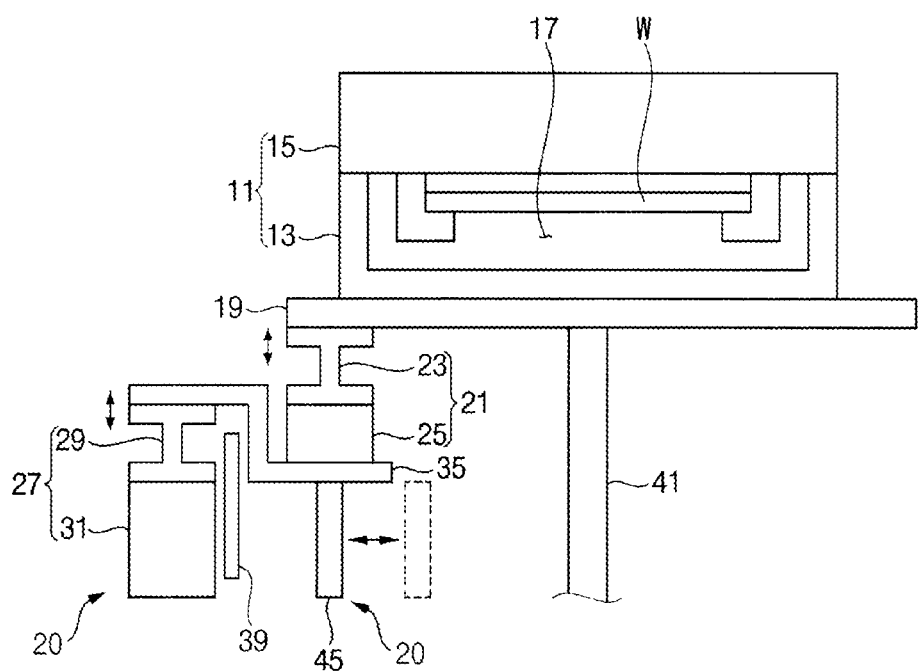
FIG. 3 is a cross-sectional view illustrating an apparatus for processing a substrate in accordance with other example embodiments of the invention.

FIG. 3 is a cross-sectional view illustrating an apparatus for processing a substrate in accordance with other example embodiments of the invention. The apparatus for processing a substrate in FIG. 3 may have a configuration substantially the same as or similar to the configuration of the apparatus for processing a substrate described with reference to FIG. 1 except a compensating member.

Referring to FIG. 3, the apparatus for processing a substrate may include a compensating member 36 disposed between the first driving element 21 and a bottom of the apparatus for processing a substrate. Here, the compensating member 36 may include a rod element 45 which may extend from the bottom of the apparatus for processing a substrate to the connecting element 33 coupled to the first body 25 of the first driving element 19. For example, the rod element 45 may move to the bottom of the apparatus for processing a substrate after the first driving element 21 and/or the second driving element 27 moves the supporting element 19 and the lower chamber 13 in the upward direction.

In other example embodiments, the rod element 45 may prevent the lower chamber 13 and the supporting element 19 from being tilted downwardly by the force for moving the lower chamber 13 applied to one end portion of the supporting element 19 from the first driving element 21 and/or the second driving element 27 connected to one end portion of the supporting element 19. Thus, the supporting element 19 and the lower chamber 13 may stably move in the upward and downward directions by the rod element 45 without the tiltings of the supporting element 19 and the lower chamber 13.

Figure 4:
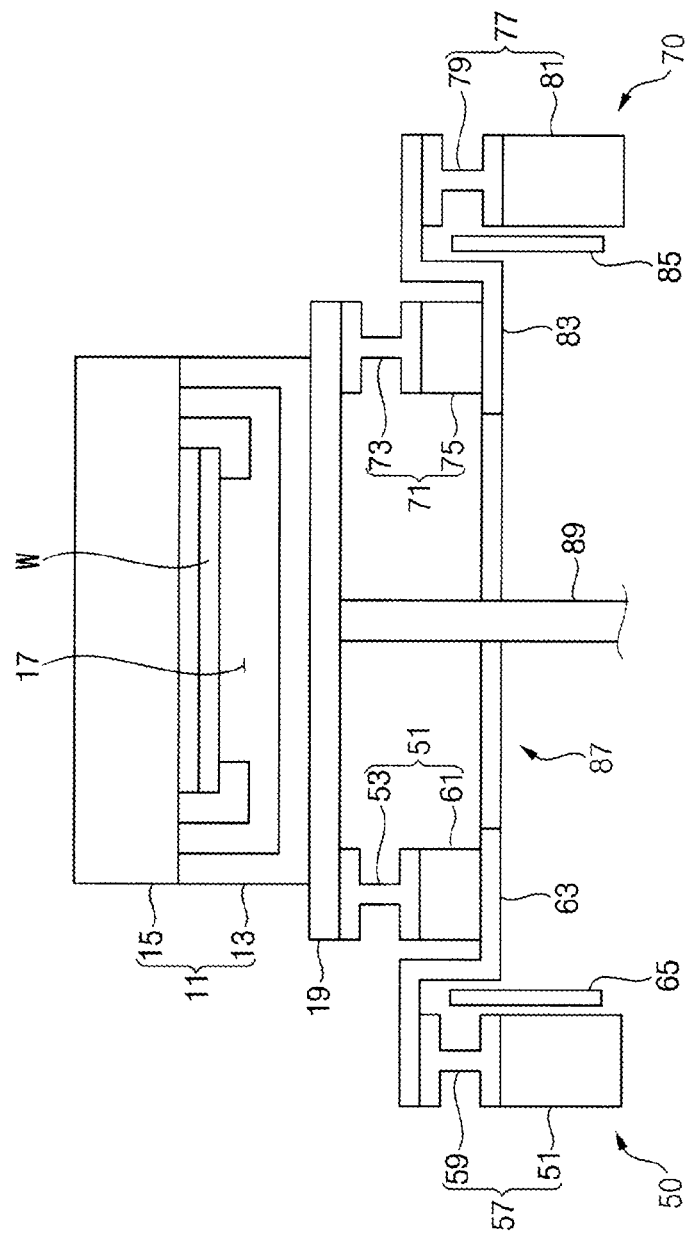
FIG. 4 is a cross-sectional view illustrating an apparatus for processing a substrate in accordance with other example embodiments of the invention.

FIG. 4 is a cross-sectional view illustrating an apparatus for processing a substrate in accordance with other example embodiments of the invention. The apparatus for processing a substrate in FIG. 4 may have a configuration substantially the same as or similar to the configuration of the apparatus for processing a substrate described with reference to FIG. 1 except a plurality of driving members, a plurality of balancing members and a compensating member.

Referring to FIG. 4, the apparatus for processing a substrate may include a first driving member 50, a second driving member 70, a first balancing member 65 and a second balancing member 85. However, the compensating member maybe omitted in the apparatus for processing a substrate illustrated in FIG. 4.

Similarly, the apparatus for processing a substrate may include the process chamber 11 having the lower chamber 13 and the upper chamber 15. The lower chamber 13 may be moved in the upward and downward directions by the first driving member 50 and the second driving member 70, and thus the lower chamber 13 may be combined with the upper chamber 15 and may be separated from the upper chamber 15. When the lower chamber 13 is combined with the upper chamber 15, the processing spacer 17 may be formed between the lower chamber 13 and the upper chamber 15.

In other example embodiments, the first driving member 50 may be connected to one end portion of the supporting element 19 and the second driving member 70 may be coupled to the other end portion of the supporting element 19. Thus, the supporting element 19 and the lower chamber may be balanced by the first and second driving members 50 and 70 without the compensating member.

The first driving member 50 may include a first driving element 51 connected to one end portion of the supporting element 19 in the downward direction, a second driving element 57 disposed adjacent to the first driving element 51 in the downward direction, and a first connecting element 63 for connecting the first driving element 51 to the second driving element 57. The first driving element 51 may include a first driving shaft 53 and a first body 55. The second driving element 57 may include a second driving shaft 59 and a second body 61. The first connecting element 63 may have a first portion connected to the first driving element 51, a second portion coupled to the second driving element 57, and a middle portion connecting the first portion to the second portion. The first balancing member 65 may be positioned between the first driving element 51 and the second driving element 57.

The second driving member 70 may include a third driving element 71 connected to the other end portion of the supporting element 19 in the downward direction, a fourth driving element 77 disposed adjacent to the third driving element 71 in the downward direction, and a second connecting element 83 for connecting the third driving element 71 to the fourth driving element 77. The third driving element 51 may include a third driving shaft 73 and a third body 75, and the fourth driving element 77 may include a fourth driving shaft 79 and a fourth body 81. The second connecting element 83 may have a first portion connected to the third driving element 71, a second portion coupled to the fourth driving element 77, and a middle portion connecting the first portion to the second portion. The second balancing member 85 may be positioned between the third driving element 71 and the fourth driving element 77.

According to other example embodiments, the apparatus for processing a substrate may include the first driving member 50 and the second driving member 70 substantially symmetrically coupled to one end portion and the other end portion of the supporting element 19, respectively. Therefore, the supporting element 19 and the lower chamber 13 may be balanced by the symmetrically disposed first and second driving members 50 and 70 without any compensating member. That is, the supporting element 19 and the lower chamber 13 may not be tilted by the first and second driving members 50 and 70 while the supporting element 19 and the lower chamber 13 are moved by the first and second driving members 50 and 70 in the upward and downward directions.

In other example embodiments, a central portion of the supporting element 19 (i.e., a central portion of the lower chamber 13) may be bent since the first and second driving members 50 and 70 are symmetrically connected to one end and the other end portions of the supporting element 19. To prevent the bending of the supporting element 19, the apparatus for processing a substrate may additionally include an adjusting member 87 for connecting the first driving member 50 to the second driving member 70. For example, the adjusting member 87 may extend from the first connecting element 63 of the first driving member 50 to the second connecting element 83 of the second driving member 70. The first driving member 50 and the second driving member 70 may maintain a constant distance by the adjusting member 87 such that the supporting element 19 and the lower chamber 13 may not be bent. For example, the adjusting member 87 may have a plate structure.

Figure 5:
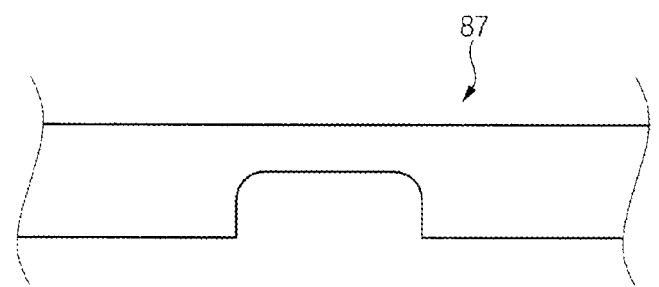
FIG. 5 is an enlarged cross-sectional view illustrating an adjusting member in FIG. 4.

FIG. 5 is an enlarged cross-sectional view illustrating the adjusting member 87 in FIG. 4.

Referring to FIG. 4 and FIG. 5, the adjusting member 87 may have the plate structure in which a central portion has a thickness smaller than thicknesses of both lateral portions. Although it is not illustrated, the central portion of the adjusting member 87 may have a through hole and the discharging member 89 may pass through such through hole of the adjusting member 87.

Hereinafter, a method of processing a substrate using the apparatus for processing a substrate according to example embodiments. Here, the method of processing a substrate may be performed using the apparatus for processing a substrate described with reference to FIG. 1. However, those ordinary skilled in the art can understand that the method of processing a substrate may be executed by any one of the apparatuses for processing a substrate described with reference to FIG. 2 to FIG. 4.

As described with reference to FIG. 1, the substrate W may be placed on the supporting member coupled to the upper chamber 15. The supporting element 19 and the lower chamber 13 may be moved by the driving member 20 including the first and the second driving elements 21 and 27 such that the lower chamber 13 may be combined with the upper chamber 15. Thus, the processing space 17 may be formed between the lower chamber 13 and the upper chamber 15.

The predetermined process, for example, the cleaning process using the supercritical fluid may be performed on the substrate W positioned in the processing space 17. After performing the cleaning process on the substrate W, the lower chamber 13 and the supporting element 19 may be moved by the driving member 20 in the downward direction. The used supercritical fluid may be discharged from the process chamber 11 though the discharging member 41.

As described above, the lower chamber 13 and the supporting element 19 may be balanced by the compensating member 36 without fillings of lower chamber 13 and the supporting element 19 while the lower chamber 13 and the supporting element 19 may be moved by the driving member 20 including the first and second driving elements 21 and 27 in the upward and downward directions.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of processing a substrate, which comprises:
placing a substrate on a supporting member coupled to an upper chamber;
combining a lower chamber with the upper chamber using a driving element including s supporting element for supporting the lower chamber; a first driving element for moving the lower chamber and the supporting element; a second driving element for moving the lower chamber, the supporting element and the first driving element, the second driving element being disposed adjacent to the first driving element; and a connecting element for connecting the first driving element to the second driving element; and
performing a predetermined process on the substrate positioned in a processing space provided between the lower chamber and the upper chamber.

2. The method of processing a substrate of claim 1, wherein the driving member is connected to one end portion of the supporting element, and the supporting element and the lower chamber are balanced by a compensating member connected to the other end portion of the supporting element.

3. The method of processing a substrate of claim 1, wherein the first driving element includes a first driving shaft and a first body, the second driving element includes a second driving shaft and a second body, and the first and second driving elements are disposed in parallel.

4. The method of processing a substrate of claim 1, wherein a tinting of the first driving element and/or the second driving element is prevented by a balancing member coupled to the second driving element and extended toward the connecting element while the supporting element and the lower chamber moves in the upward and downward directions.

5. The method of processing a substrate of claim 1, wherein the predetermined process includes a cleaning process using a supercritical fluid.

* * * * *